United States Patent [19]
Nishi

[11] Patent Number: 5,178,639
[45] Date of Patent: Jan. 12, 1993

[54] VERTICAL HEAT-TREATING APPARATUS

[75] Inventor: Hironobu Nishi, Sagamihara, Japan

[73] Assignee: Tokyo Electron Sagami Limited, Kanagawa, Japan

[21] Appl. No.: 723,382

[22] Filed: Jun. 28, 1991

[30] Foreign Application Priority Data

Jun. 28, 1990 [JP] Japan .................................. 2-171064
Jun. 28, 1990 [JP] Japan .................................. 2-171065

[51] Int. Cl.⁵ .............................................. H01L 21/69
[52] U.S. Cl. .................................. 29/25.02; 414/152; 414/172; 414/404
[58] Field of Search .................. 29/25.01, 25.02; 414/404, 152, 172

[56] References Cited

U.S. PATENT DOCUMENTS

| | | | |
|---|---|---|---|
| 4,938,691 | 7/1990 | Ohkase et al. | 414/152 |
| 4,947,784 | 8/1990 | Nishi | 414/404 |
| 4,955,775 | 9/1990 | Ohkase et al. | 414/152 |
| 5,028,195 | 7/1991 | Ishii et al. | 414/172 |
| 5,030,057 | 7/1991 | Nishi et al. | 414/416 |
| 5,048,164 | 9/1991 | Harima | 414/404 |

Primary Examiner—Brian E. Hearn
Assistant Examiner—Kevin M. Picardat
Attorney, Agent, or Firm—Oblon, Spivak, McClelland, Maier & Neustadt

[57] ABSTRACT

A vertical heat-treating apparatus which is effective for preventing dust or fine particles from being attached to a wafer during the loading/unloading or transport of the wafer thereby to manufacture a high-quality wafers. This apparatus comprises a carrier stocker storing a plurality of wafer carriers, a loading/unloading mechanism for transferring the wafers between the wafer carriers and a heat-treating vessel, a plurality of heat-treating furnaces for heat-treating the wafers, a transport mechanism for transporting the heat-treating vessel to and from the vertical heat-treating furnace, and gas supply means for forming a clear gas stream passing exclusively through the loading/unloading mechanism and/or the transport mechanism.

13 Claims, 4 Drawing Sheets

VERTICAL HEAT-TREATING APPARATUS

BACKGROUND OF THE INVENTION

1. Field of the Invention

The present invention relates to a heat-treating apparatus for treating a wafer-like material such as a semiconductor wafer and a liquid crystal wafer, particularly, to a vertical heat-treating apparatus comprising a plurality of reaction tubes arranged in a vertical direction for heat-treating wafers.

2. Description of the Related Art

In recent years, vigorous researches have been made in an attempt to develop a vertical heat-treating apparatus used in the thermal diffusion step or film-forming step in the manufacture of a semiconductor device because a vertical apparatus permits saving the required space and energy, facilitates the treatment of a semiconductor wafer having a large diameter, and is capable of readily coping with the automation of the apparatus.

The vertical heat-treating apparatus comprises various heat-treating devices such as an oxidation device for forming an oxide film, a metal film, a monocrystalline film, or for performing an impurity diffusion, a CVD device, an epitaxial device and a diffusion device. In each of these heat-treating devices, a coil heater is wound about a reaction tube standing upright so as to heat semiconductor wafers housed in the reaction tube to 500° to 1250° C., thereby to form a film on the wafer or to diffuse an impurity into the wafer. For performing these treatments within the heat-treating device, it is necessary to use a wafer supporting body which has a high heat resistance and does not generate an impurity under high temperatures. In general, a quartz boat is used as such a wafer supporting body meeting the requirements given above.

In performing the heat treatment, a carrier supporting, for example, 25 semiconductor wafers is taken out of a carrier stocker and moved onto a wafer transfer device. Then, the semiconductor wafers are transferred onto the quartz boat which is held horizontal. The quartz boat is then converted from the horizontal state into the vertical state by a boat driving mechanism. Under this condition, the quartz boat supporting the semiconductor wafers is moved onto a boat transfer device and, then, into one of a plurality of heat-treating furnaces.

The wafer transfer device is constructed such that the carrier vertically supporting a plurality of parallel-arranged semiconductor wafers is taken out of the clean wafer stocker. Then, the supporting body is elevated from below the carrier so as to collectively support the semiconductor wafers in an upper position. The collectively supported wafers are held by a holding means and moved horizontally onto a quartz boat disposed horizontally near the holding means. Then, the holding means is moved downward so as to transfer the wafers onto the quartz boat, followed by releasing the holding means. The operations described above are reversed in the case where the treated semiconductor wafers are brought back onto the carrier. What should be noted is that the driving mechanism is frequently operated in the steps of transferring the semiconductor wafers. Naturally, dust or fine particles are generated by the operation of the driving mechanism, making it very difficult to prevent the dust or fine particles from being attached to the semiconductor wafers, even if the carrier supporting the wafers is stocked in a clean carrier stocker.

The dust or fine particles is also generated during the quartz boat transfer from the boat driving mechanism into the heat-treating furnace, leading to the dust attachment to the wafer, etc. Naturally, contamination of the wafer leads to a low yield of the semiconductor device. The difficulty is rendered more and more serious in accordance with the recent requirement for a higher integration degree of a semiconductor device.

SUMMARY OF THE INVENTION

An object of the present invention is to provide a vertical heat-treating apparatus which is effective for preventing dust or fine particles from being attached to a wafer during the loading/unloading or transport of the wafer, making it possible to continuously manufacture high-quality wafers. The term "wafer" used herein denotes any of wafer-like materials such as semiconductor wafers, liquid crystal substrates, etc.

According to the present invention, there is provided a vertical heat-treating apparatus, comprising:

a carrier stocker storing a plurality of carriers each supporting a plurality of wafers;

a loading/unloading mechanism so disposed as to receive the carriers from or to deliver the carriers to the carrier stocker for transferring the wafers from the carrier to a heat-treating vessel, or from the heat-treating vessel to the carrier;

a plurality of heat-treating furnaces storing the heat-treating vessel having the wafers mounted thereon for applying a predetermined heat treatment to the wafers;

a transport mechanism for transporting the heat-treating vessel from the loading/unloading mechanism to the vertical heat-treating furnace or from the vertical heat-treating furnace to the loading/unloading mechanism; and gas supply means for forming a clean gas stream passing exclusively through the loading/unloading mechanism.

According to another embodiment of the present invention, there is provided a vertical heat-treating apparatus, comprising:

a carrier stocker storing a plurality of carriers each supporting a plurality of wafers;

a loading/unloading mechanism so disposed as to receive the carriers from or to deliver the carriers to the carrier stocker for transferring the wafers from the carrier to a heat-treating vessel, or from the heat-treating vessel to the carrier;

a plurality of vertical heat-treating furnaces storing the heat-treating vessel having the wafers mounted thereon for applying a predetermined heat treatment to the wafers;

a transport mechanism for transporting the heat-treating vessel from the loading/unloading mechanism to the vertical heat-treating furnace or from the vertical heat-treating furnace to the loading/unloading mechanism; and gas supply means for forming a clean gas stream passing exclusively through the loading/unloading mechanism.

The gas supply means may be the furnished to both of the loading/unloading mechanism and the transport mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

Figure 1:
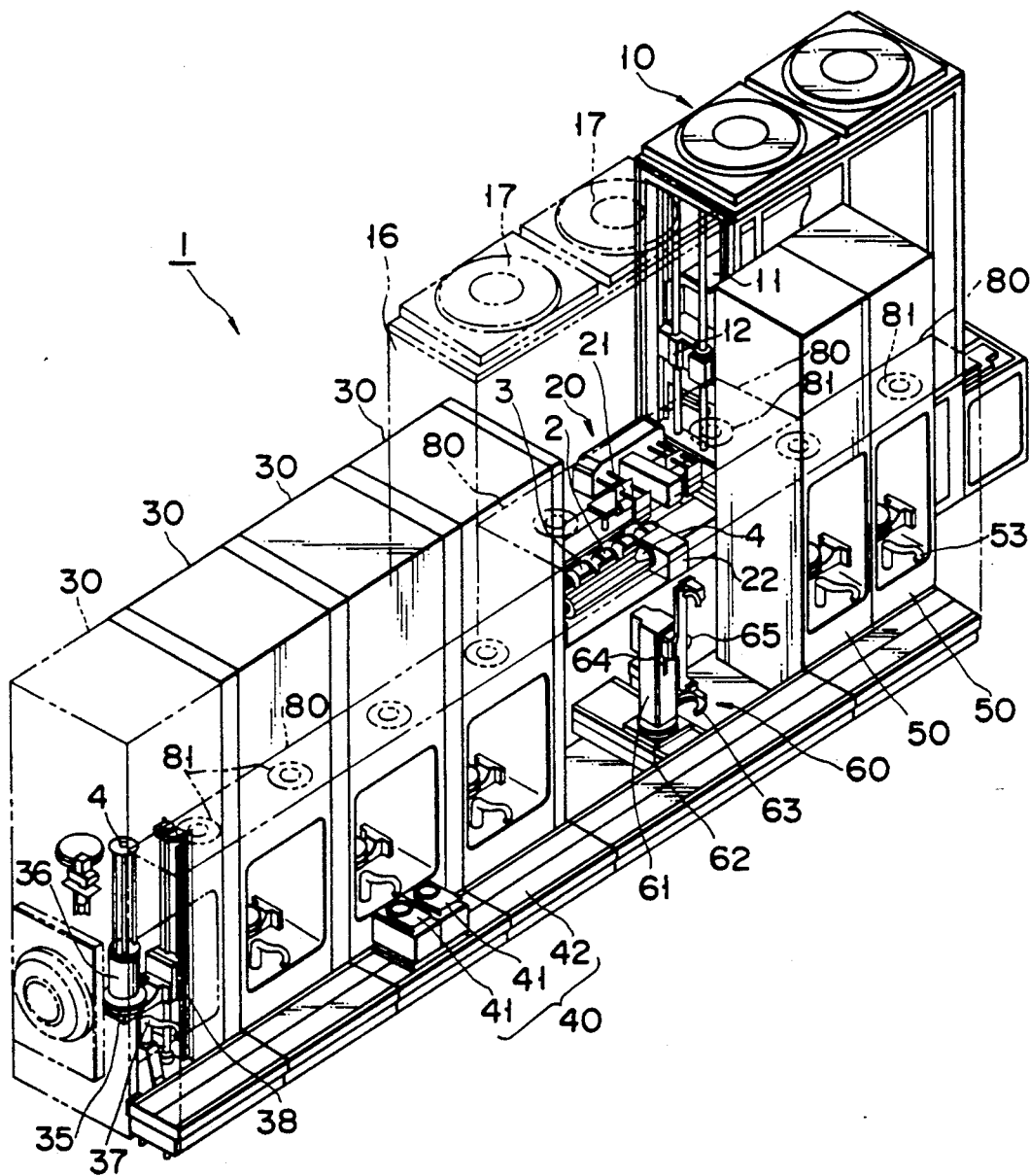
FIG. 1 is an oblique view showing an apparatus according to one embodiment of the present invention.

The accompanying drawings collectively show a vertical heat-treating apparatus 1 according to one embodiment of the present invention. The apparatus shown in the drawings is for applying a heat treatment to semiconductor wafers.

Figure 2:
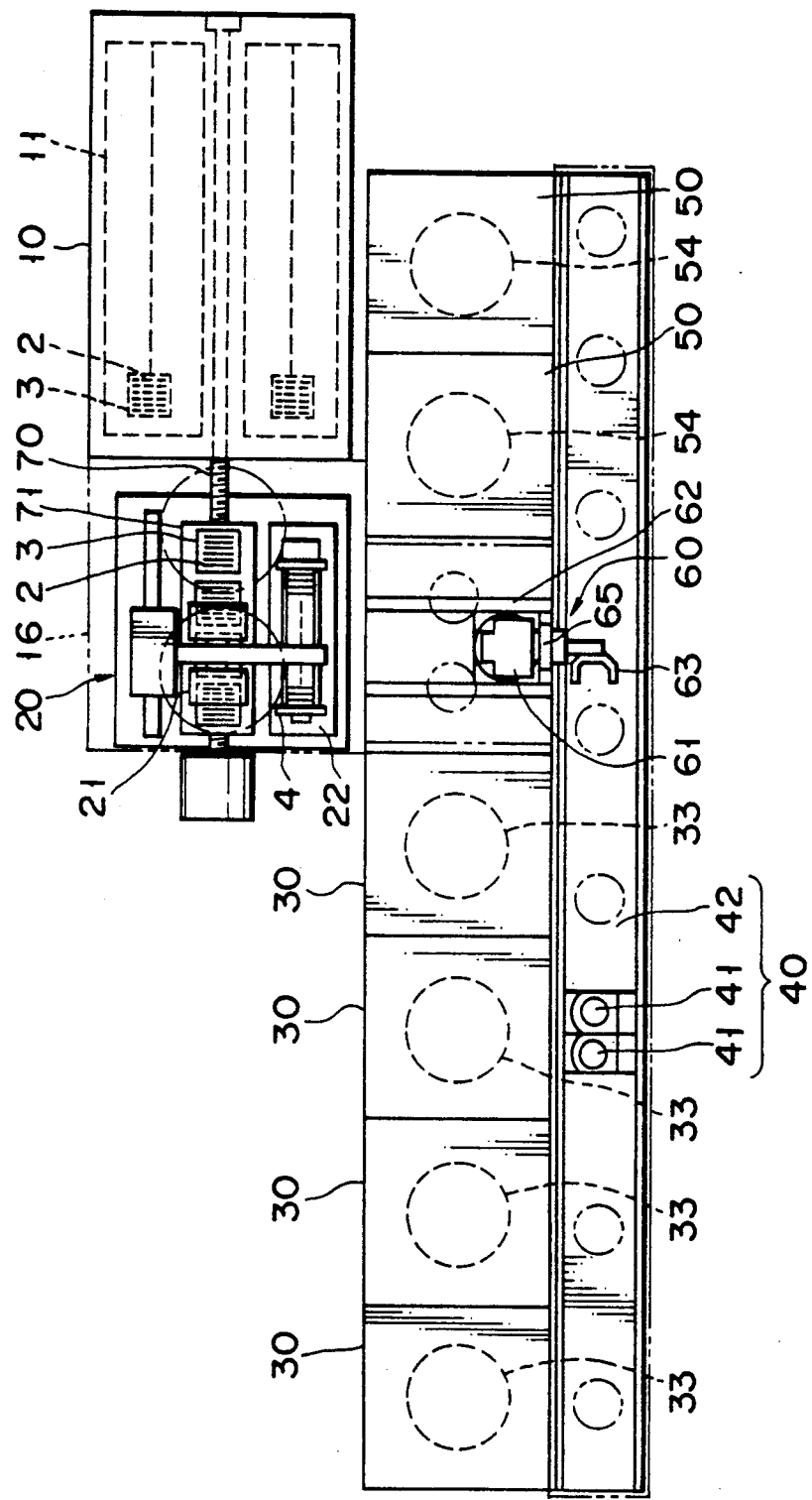
FIG. 2 is a plan view of the apparatus shown in FIG. 1.

As shown in FIGS. 1 and 2, the apparatus 1 comprises a carrier stocker 10, a loading/unloading mechanism 20, a plurality of vertical heat-treating furnaces 30 arranged in parallel, a boat transport mechanism 40, a boat stocker 50, and a boat loading/unloading mechanism 60. A large number of wafer carriers 3 each supporting a semiconductor wafer 2, which is to be subjected to a heat treatment, can be housed in the carrier stocker 10. The semiconductor wafer 2 supported by the wafer carrier 3 is transferred onto a wafer boat 4 made of, for example, quartz by the loading/unloading mechanism 20. The wafer boat 4 supporting the wafer carrier 3 is then transferred into the vertical heat-treating furnace 30. The boat transport mechanism 40, which extends in the direction of arrangement of the vertical heat-treating furnaces 30 and is positioned in front of the arrangement of the furnaces 30, serves to transport the wafer boat 4 in an upright state. The boat stocker 50, which extends along the boat transport mechanism 40 and is positioned in the waiting position of the semiconductor wafer 2, serves to apply pre-treatment to the wafer. Further, the boat loading/unloading mechanism 60 serves to transfer the wafer boat 4 between the wafer loading/unloading mechanism 20 and the boat transport mechanism 40 while performing a horizontal-vertical conversion.

The carrier stocker 10 is provided with multi-stages of carrier racks 11. A plurality of wafer carriers 3, e.g., six wafer carriers, are disposed on each carrier rack 11. The number of the carriers which will be mounted on one row of the carrier rack 11 is so adjusted that all of the carriers mounted on one row can be simultaneously transferred as one unit to the next step for the convenience of operation. For example, if 100 wafers are to be simultaneously heat-treated in one heat treatment, four carriers, each carrying 25 wafers, are mounted on the one row of the carrier rack 11. The carrier stockers 10 is also provide with a means to flow a clean air as a laminar flow, for example, in parallel with the main surfaces of the wafers. Transport of the wafer carrier 3 between the carrier stocker 10 and the wafer loading/unloading mechanism 20 is performed by a carrier transport mechanism 70. The carrier stocker 10 is also provided with a carrier holding-transferring mechanism 12 movable in the x-z direction, i.e., vertical and horizontal directions, and serving to transfer the wafer carrier 3 from the carrier rack 11 to the carrier transport mechanism 70. A down flow of a clear air is effected also in this region of the mechanism 12.

The wafer loading/unloading mechanism 20 comprises a wafer handling portion 21 serving to collectively hold a plurality of semiconductor wafers 2. The handling portion 21 serves to perform transference of the wafer 2 between the wafer boat 4 horizontally disposed on a boat support member 22 by the boat loading/unloading mechanism 60 and the plurality of wafer carriers 3 transported toward the wafer loading/unloading mechanism 20 by the carrier transport mechanism 70. Prior to the step of transferring the wafer 2 from the wafer carrier 3 to the wafer boat 4, the registration of wafers, i.e., the plane of the orientation flat of every wafers is directed to a prescribed position, for example downward by means of an orientation liner (not shown).

Figure 3:
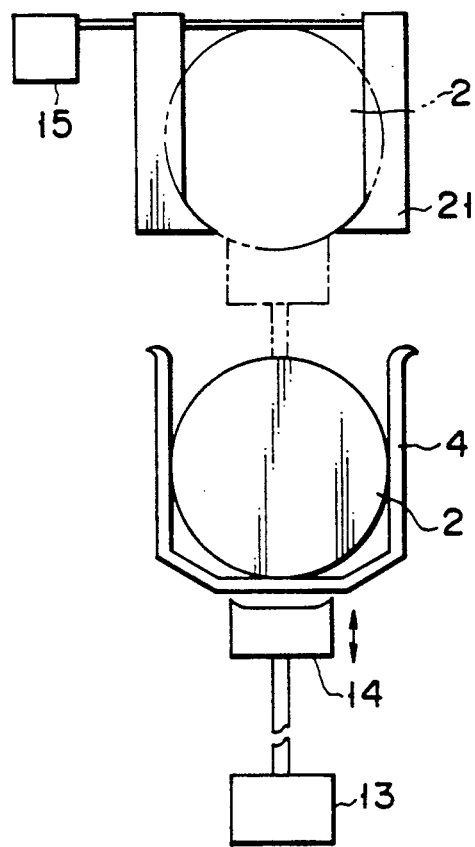
FIG. 3 is a side view showing the gist portion of the loading/unloading mechanism included in the apparatus shown in FIG. 1.

To be more specific, FIG. 3 shows that provided is a support body 14 connected to a vertical driving mechanism 13. All the wafers 2 supported by a single carrier 3 are moved upward and collectively supported by the support body 14. The handling portion 21 serving to horizontally hold the wafers 2 supported by the support body 14 at the elevated position is connected to a horizontal and vertical driving mechanism 15 so as to permit the wafer 2 to be transferred onto the boat 4.

Figure 4:
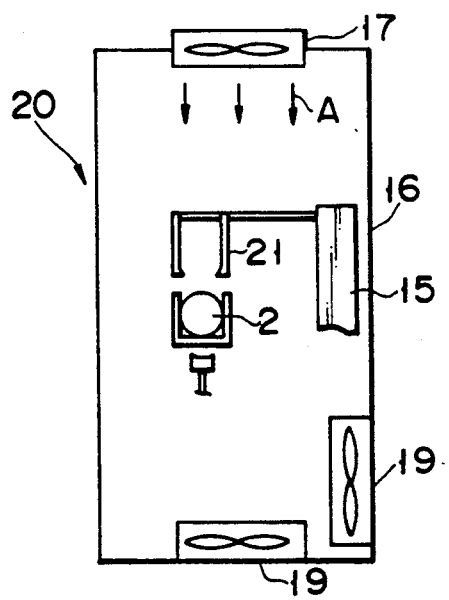
FIG. 4 schematically shows the portion of the wafer loading/unloading mechanism included in the apparatus shown in FIG. 1.

The wafer loading/unloading mechanism 20 described above is substantially sealed as shown by a dotted line from the outer atmosphere by a storing 16, which is formed of an anti-static transparent plastic material such as vinyl chloride resin or acrylic resin. Of course, the inner condition of the storing 16 can be observed from outside. An air filter 17, which may be provided with a fan, is formed on the upper surface of the storing 16. Fine particles having a particle diameter as small as 0.1 μm can be removed by the air filter 17. As shown in FIG. 4, the loading/unloading mechanism 20 covered with the housing 16 is provided at each of the side wall and the bottom wall with an exhaust mechanism, e.g., a fan 19, so as to permit a clean air stream A to positively flow as a laminar flow through the loading/unloading mechanism 20.

The boat loading/unloading mechanism 60 is provided with a boat rotating device 61 and a horizontal driving device 62. The boat rotating device 61 comprises a handling portion 63 serving to support both ends of a wafer boat, a vertical driving mechanism 64 and a rotary driving mechanism 65. The boat loading/unloading mechanism 60 receives a horizontal wafer boat 4 having the wafers 2 mounted thereon by the wafer loading/unloading mechanism 20 and, while converting the wafer boat 4 into a vertical state, serves to transfer the wafer boat 4 onto the boat mounting portion 41 of the boat transport mechanism 40.

The boat transport mechanism 40 comprises a transport rail 42, a stage 43 moving along the transport rail 42, a boat mounting portion 41 mounted on the stage 43 and driving mechanisms (not shown) for these members. The boat mounting portion 41 having the wafer boat 4 vertically mounted thereon is transported along the rail 42 to the boat stocker 50 or the vertical heat-treating furnace 30.

Figure 5:
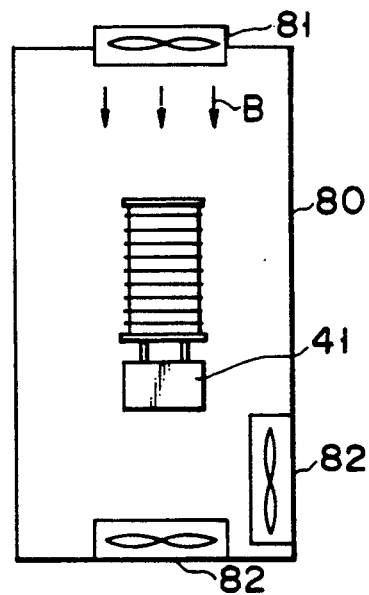
FIG. 5 schematically shows the portion of the boat loading/unloading mechanism included in the apparatus shown in FIG. 1.

A casing 80 is mounted to cover the upper and side walls of the boat loading/unloading mechanism 20 and the boat transport mechanism 40 except for that side wall of the boat transport mechanism 40 which faces the boat loading/unloading mechanism 20. A plurality of air filters 81 are mounted to cover the entire upper surface of the casing 80. The combination of this casing 80 and the air filters 81 is substantially equal in construction to the combination of the storing 16 covering the wafer loading/unloading mechanism 20 and the air filters 17. To be more specific, a fan 82 is provided in each of the bottom wall and the side wall of the casing 80, as shown in FIG. 5. As apparent from the drawing, a clean air stream B passing through the air filter 81, which may be provided with a fan, flows downward through the boat loading/unloading mechanism 60 and the boat transport mechanism 40.

Figure 6:
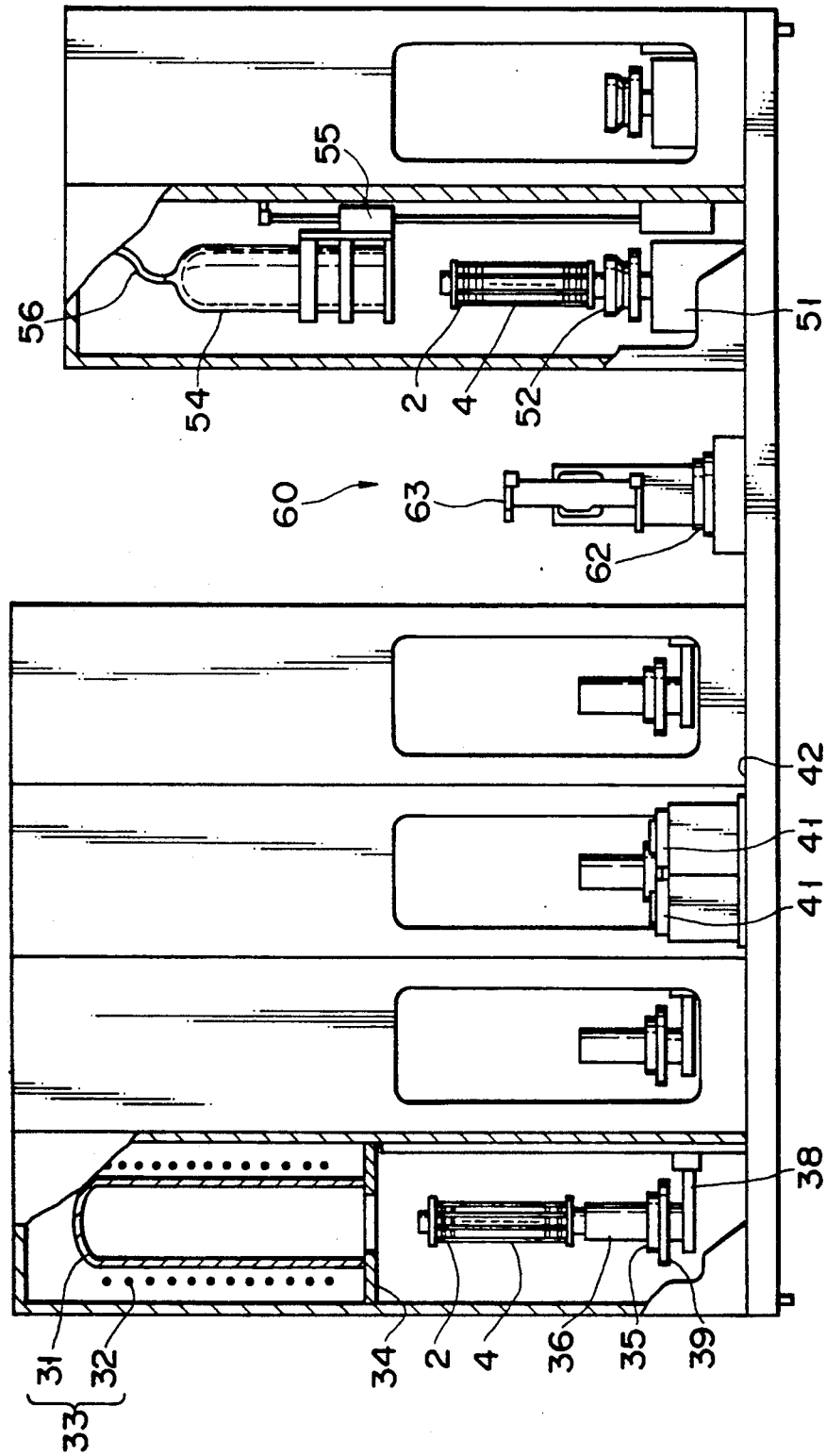
FIG. 6 is a side view schematically showing the gist portion of the apparatus of the present invention.

Each of the vertical heat-treating furnaces 30 is constructed as shown in FIG. 6. As seen from the drawing, the furnace 30 comprises a heat treating furnace body 33 consisting of a reaction vessel 31 made of, for example, quartz, and a coil heater 32 surrounding the reaction vessel 31. The heat-treating furnace body 33 is fixed substantially upright to a base plate 34.

The wafer boat 4 having a plurality of semiconductor wafers 2 mounted thereon is transferred by a boat transfer arm 37 from the boat transport mechanism 40 into a region above a heat-insulated cylinder 36 mounted on a turntable 35 which is rotatable. The wafer boat 4 is further loaded in the reaction vessel 38 by a vertically transporting mechanism, e.g., a boat elevator 38. The open end of the reaction vessel 31 is closed or opened by a disk-shaped cap portion 39 which is vertically moved by the boat elevator 38 together with the turntable 35, etc.

Two boat stockers 50 are arranged in parallel such that the wafer boat 4 supporting the untreated semiconductor wafers 2 is disposed in a waiting position. The particular construction makes it possible to suppress the reduction in the treating efficiency caused by the wafer transfer time. In addition, a pretreatment is applied to the semiconductor wafer 2 so as to improve the quality of the treated wafer.

It will be desirable in view of increasing the productivity to provide the boat stockers 50 not only with a stocker for storing a boat carrying untreated wafers, but also with a stocker for storing a boat carrying treated wafers. The latter stocker may the provided with a means for flowing a cool air stream to cool the heated wafers. It is also preferable in view of saving the space of the stocker to stand by the wafer boat 4 in an upright state.

Each of the boat stockers 50 is disposed on the turntable 52 which can be rotated by the rotary driving mechanism 51. The wafer boat 4 is transferred from the boat transport mechanism 40 onto the turntable 52 by the boat transfer arm 53. This transfer of the wafer boat 4 is performed with the wafer boat 4 being set upright.

Also, a cylindrical reaction tube 54 made of, for example, quartz is disposed above the turntable 52 such that the transfer of the wafer boat 4 is not obstructed by the reaction tube 54. The reaction tube 54 can be vertically moved by an elevator mechanism 55 in a manner to surround the wafer boat 4 mounted on the turntable 52.

A treating gas inlet pipe 56 is connected to the reaction tube 54. A desired pre-treating gas such as a nitrogen gas or an etching gas is introduced into the reaction tube 54 through the inlet pipe 56 so as to apply a desired pre-treatment to the untreated semiconductor wafer 2. In the case of using, for example, a nitrogen gas as a pre-treating gas, it is possible to prevent a natural oxide film from being formed on the semiconductor wafer 2 or to prevent dust from being attached to the wafer 2. In the case of using an etching gas, it is possible to remove the natural oxide film formed in, for example, the previous step immediately before the heat treatment.

In the vertical heat-treating apparatus 1 described above, four vertical heat-treating furnaces 30 are arranged in parallel, making it possible to perform simultaneously different heat treatments, e.g., Si epitaxial growth and thermal diffusion. In order to prevent a cross contamination caused by the different heat treatments, two sets of the system are provided in the contact portions of the wafer boat 4, e.g., the boat mounting portion 41 of the boat transport mechanism 40, the boat holding portion (not shown) of the boat transfer mechanism 60, and the boat mounting plate (not shown) of the wafer loading/unloading mechanism 20. It is possible to selectively use any of these two members of the system depending on the specific treatment applied to the wafers on the wafer boat 4.

In operating the vertical heat-treating apparatus 1, the wafer carrier 3 transferred from the carrier rack 11 of the carrier stocker 10 onto the carrier plate 71 of the carrier transport mechanism 70 is transported toward the wafer loading/unloading mechanism 20. On the other hand, the wafer boat 4 is transferred by the boat loading/unloading mechanism 60 onto the boat support plate 22. The semiconductor wafer 2 held by the wafer carrier 3 is transferred onto the wafer boat 4. During the operation, the fans 19 mounted on the side wall and the bottom of the wafer loading/unloading mechanism 20 are driven so as to take in the clean air stream A through the air filter 17 formed on the upper wall. Since the wafer loading/unloading mechanism 20 is isolated from, for example, a clean room by the casing 16, the clean air stream A efficiently forms a downflow within the transferring space so as to remove fine dust or particles generated during the operation.

The support member 14 is moved upward within the clean air stream region by the vertical driving mechanism 13 so as to collectively move upward all the semiconductor wafers 2 housed in a single carrier 3. The semiconductor wafers moved upward are horizontally held by the wafer handling portion 21 horizontally moved to the desired position by the driving mechanism 15. Then, the support member 14 is moved downward by the vertical driving mechanism 13. Also, the wafer handling portion 21 is horizontally moved onto the boat 4 by the driving mechanism 15 and, then, moved downward so as to transfer the wafer 2 onto the boat 4. Then, the wafer handling portion member 21 is opened so as to release the wafer 2 and, then, moved to the position of the next carrier 3. The operations described above are repeated for each carrier so as to transfer the wafer 2 onto the boat 4.

Upon completion of the wafer transfer, the wafer boat 4 having the wafers 2 mounted thereon is transferred to the boat transport mechanism 40 while a horizontal-vertical conversion is performed by the boat loading/unloading mechanism 60. To be more specific, the boat 4 having the wafer 2 mounted thereon is held by handling portion 63 of the boat rotating device 61 which is moved by the horizontal driving mechanism 62. Further, the boat 4 is changed from the horizontal holding to a vertical holding by the vertical driving mechanism 64 of the boat rotary device 61 moved to a predetermined position by the horizontal driving mechanism 62. Still further, the boat rotary device 61 is moved downward by the vertical driving mechanism 64 so as to transfer the vertically held-boat 4 onto the boat supporting position of the boat transport mechanism 40.

In the next step, the wafer boat 4 is transported by the boat transport mechanism 40 onto each boat stocker 50 or each vertical heat-treating furnace 30 in accordance with the treating program. For example, the wafer boat 4 transported into the vertical heat-treating furnace 30 is disposed on the heat-insulated cylinder 36 and, then, loaded by the boat elevator 38 in the reaction vessel 31 which is preliminarily heated to about, for example, 800° C. Further, the reaction vessel 31 is hermetically closed by the cap portion 39. Under this condition, a treating gas, e.g., $SiH_2Cl_2$, HCl, $H_2$, is introduced through a gas inlet pipe (not shown) into the reaction vessel 31 maintained at a predetermined degree of vacuum, e.g., about 10 Torr, so as to apply a predetermined treatment, e.g., Si epitaxial growth, to the semiconductor wafer 2.

The wafer boat 4 transported into the boat stocker 50 is disposed on the turntable 52 and covered with the reaction tube 54 which has been moved downward. Under this condition, a desired pre-treatment is applied during the waiting period in the heat-treating step to the wafer by the pre-treating gas supplied through the treating gas inlet pipe 56 such as a nitrogen gas or an etching gas. Transfer of the wafer 2 and transport of the wafer boat 4 into the vertical heat-treating furnace 30 or into the boat stocker 50 are carried out successively. Also, the wafer boat 4 waiting within the boat stocker 50 is transported into the vertical heat-treating furnace 30 in accordance with the treating program.

After the heat treatment within the vertical heat-treating furnace 30, the semiconductor wafer 2 as well as the wafer boat 4 is transferred by the boat transport mechanism 40 and the boat loading/unloading mechanism 60 onto the boat holding plate 22 of the wafer loading/unloading mechanism 20 and, then, into the wafer carrier 3. The wafer carrier 3 storing the heat-treated semiconductor wafer 2 is returned to the carrier stocker 10 and, then, transported into the next step.

During the operation of these boat loading/unloading mechanism 60 and the boat transport mechanism 40, the fans 82 mounted at the side wall and bottom wall of these mechanisms 60 and 70 are operated so as to take in the clean air stream B through the air filter 81 mounted at the upper wall. Since the boat loading/unloading mechanism 60 and the boat transport mechanism 70 are isolated from the clean room or the like by the casing 80, the clean air stream B forms an efficient downflow through these spaces so as to eliminate the fine dust or particles generated during the operation.

As described above, the vertical heat-treating apparatus of the present invention comprises boat stockers 50 as a waiting position of the wafer boat 4 having semiconductor wafers 2 mounted thereon. The particular construction makes it possible to suppress the reduction in the treating efficiency accompanying the transfer of the semiconductor wafer 2 regardless of the kind of specific treatment applied to the wafer 2. What should also be noted is that the carrier stocker 10 for storing the wafer carrier 3 transported from the previous step, the loading/unloading mechanism 20 of the semiconductor wafer 2, and the mechanisms 40 and 60 for transferring and transporting the wafer boat 4 are disposed within a single apparatus of the present invention. It follows that it is possible to continuously carry out a series of steps involving a heat treatment. It is also possible to impart flexibility to the heat-treating operations, leading to an improved treating efficiency and to a low manufacturing cost of the semiconductor device.

Further, the boat stocker 50 is provided with the reaction tube 54 movable in the vertical direction, making it possible to apply a pre-treatment, e.g., an inert gas treatment or an etching treatment, to the wafer 2. In other words, it is possible to prevent the wafer in a waiting position from bearing a natural oxide film and to remove the natural oxide film from the wafer in the waiting position. Naturally, dust or the like is not attached to the wafer because the wafer is disposed within the reaction tube during the waiting period, leading to an improved yield of the semiconductor device.

As described above in detail, the vertical heat-treating apparatus of the present invention permits improving the heat-treating efficiency and also permits improving the yield of the semiconductor device.

To reiterate, each of the wafer loading/unloading mechanism, the boat loading/unloading mechanism and the boat transport mechanism is covered with a casing in the apparatus of the present invention. What should be noted is that the fans mounted at the side wall and bottom wall of the casing are driven so as to positively take in a clean air stream through the air filter mounted at the upper wall of the casing. As a result, a downflow of the clean air stream is formed through the wafer loading/unloading mechanism, the boat loading/unloading mechanism and the boat transport mechanism, making it possible to remove promptly the fine dust or particles generated in these loading/unloading and transport mechanisms. Naturally, fine dust or particles are prevented from being attached to the wafer, leading to an improved quality of the semiconductor device and to a high yield.

In the embodiment described above, a semiconductor wafer is treated by the apparatus of the present invention. However, any kind of wafer-shaped materials requiring a treatment under a clean atmosphere such as a liquid crystal driving circuit board, or a TFT circuit board can be treated by the apparatus of the present invention.

Additional advantages and modifications will readily occur to those skilled in the art. Therefore, the invention in its broader aspects is not limited to the specific details and representative devices, shown and described herein. Accordingly, various modifications may be made without departing from the spirit or scope of the general inventive concept as defined by the appended claims and their equivalents.

What is claimed is:
1. A vertical heat-treating apparatus, comprising:
   a carrier stocker for storing a plurality of carriers each supporting a plurality of wafers;

a loading/unloading mechanism so disposed as to receive the carriers from or to deliver the carriers to the carrier stocker for transferring the wafers from the carrier to a heat-treating vessel or from the heat-treating vessel to the carrier;

a plurality of vertical heat-treating furnaces each storing the heat-treating vessel having the wafer mounted therein for performing a predetermined heat treatment;

a transport mechanism for transporting the heat-treating vessel from the loading/unloading mechanism to the vertical heat-treating furnace or from the vertical heat-treating furnace to the loading/unloading mechanism; and gas supply means for forming a clean gas stream flowing exclusively through the loading/unloading mechanism.

2. The vertical heat-treating apparatus according to claim 1, wherein said gas supply means comprises a casing substantially covering the loading/unloading mechanism, a filter disposed at the top portion of the casing, and a fan system for taking in a clean gas through the filter and discharging said clean gas from below the loading/unloading mechanism.

3. The vertical heat-treating apparatus according to claim 2, wherein said fan system comprises a first fan disposed in the vicinity of the filter for taking in a clean gas, and at least one second fan disposed below the loading/unloading mechanism.

4. The vertical heat-treating apparatus according to claim 1, wherein said transport mechanism comprises a rotary driving mechanism for converting the heat-treating vessel from a horizontal state into a vertical state, and vice versa, and a transfer device receiving the heat-treating vessel from the rotary driving mechanism for transferring said vessel, which is held upright, into the vertical heat-treating furnace.

5. The vertical heat-treating apparatus according to claim 1, wherein said heat-treating vessel is a quartz boat.

6. The vertical heat-treating apparatus according to claim 4, which further comprises a heat-treating vessel stocker in which a pre-treatment is applied to the untreated wafer mounted in the heat-treating vessel and said wafer is temporarily stored, said stocker being disposed along the transfer device.

7. A vertical heat-treating apparatus, comprising:

a carrier stocker for storing a plurality of carriers each supporting a plurality of wafers;

a loading/unloading mechanism so disposed as to receive the carriers from or to deliver the carriers to the carrier stocker for transferring the wafers from the carrier to a heat-treating vessel or from the heat-treating vessel to the carrier;

a plurality of vertical heat-treating furnaces each storing the heat-treating vessel having the wafer mounted therein for performing a predetermined heat treatment;

a transport mechanism for transporting the heat-treating vessel from the loading/unloading mechanism to the vertical heat-treating furnace or from the vertical heat-treating furnace to the loading/unloading mechanism; and gas supply means for forming a clean gas stream flowing exclusively through the transport mechanism.

8. The vertical heat-treating apparatus according to claim 7, which further comprises a gas supply means for forming a clean gas stream flowing exclusively through the loading/unloading mechanism.

9. The vertical heat-treating apparatus according to claim 7, wherein said gas supply means comprises a casing substantially covering the loading/unloading mechanism, a filter disposed at the top portion of the casing, and a fan system for taking in a clean gas through the filter and discharging said clean gas from below the loading/unloading mechanism.

10. The vertical heat-treating apparatus according to claim 7, wherein said fan system comprises a first fan disposed in the vicinity of the filter for taking in a clean gas, and at least one second fan disposed below the loading/unloading mechanism.

11. The vertical heat-treating apparatus according to claim 7, wherein said transport mechanism comprises a rotary driving mechanism for converting the heat-treating vessel from a horizontal state into a vertical state, and vice versa, and a transfer device receiving the heat-treating vessel from the rotary driving mechanism for transferring said vessel, which is held upright, into the vertical heat-treating furnace.

12. The vertical heat-treating apparatus according to claim 7, wherein said heat-treating vessel is a quartz boat.

13. The vertical heat-treating apparatus according to claim 4, which further comprises a heat-treating vessel stocker in which a pre-treatment is applied to the untreated wafer mounted in the heat-treating vessel and said wafer is temporarily stored, said stocker being disposed along the transfer device.

* * * * *